Aug. 19, 1958 E. D. GREEN ET AL 2,848,613
TRANSISTOR BLOCKING OSCILLATOR
Filed Dec. 29, 1955

WITNESSES:
Bernard R. Giegay
T. N. Murray

INVENTORS
Elberson D. Green &
Martin G. Woolfson.
BY
F. E. Browder
ATTORNEY

United States Patent Office 2,848,613

Patented Aug. 19, 1958

2,848,613

TRANSISTOR BLOCKING OSCILLATOR

Elberson D. Green and Martin G. Woolfson, Baltimore, Md., assignors to Westinghouse Electric Corporation, East Pittsburgh, Pa., a corporation of Pennsylvania Application December 29, 1955, Serial No. 556,146

11 Claims. (Cl. 250—36)

This invention relates to blocking oscillators and more particularly to blocking oscillators in which a semiconductor device is used as a switching element.

In general, a blocking oscillator is one which cuts itself off after a predetermined amount of time has elapsed subsequent to the initiation of conduction in the oscillator. Conduction is initiated by a source of recurring voltage pulses which control the frequency of the oscillations produced by the oscillator.

It is an object of this invention to provide a new and improved blocking oscillator. More specifically, an object of the invention lies in the provision of a blocking oscillator employing a semiconductor device as a switching element.

Another object of the invention is to provide a transistor blocking oscillator in which the pulse width of the output pulses of the oscillator can be adjusted with the use of a time delay device connected between the collector and base of the transistor.

A still further object of the invention lies in the provision of a transistor blocking oscillator capable of producing two separate output pulses each time the oscillator is triggered, the second of said pulses being equal in width to the first but delayed from the first pulse by an amount equal to the width of the first pulse.

The above and other objects and features of the invention will become apparent from the following detailed description taken in connection with the accompanying drawings which form a part of this specification and in which.

Figure 1:
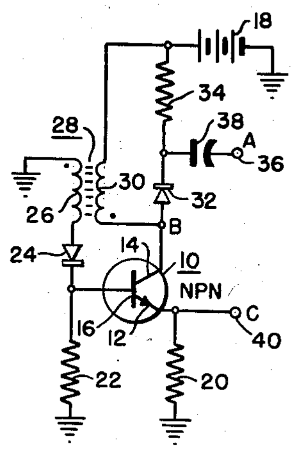
Fig. 1 is a schematic illustration of a basic embodiment of the invention.

Referring to Fig. 1, the embodiment of the blocking oscillator shown comprises an NPN junction transistor 10 having an emitter 12, collector 14 and base 16. In accordance with well known transistor theory, the NPN junction transistor 10 consists of a crystal of P-type germanium bounded by two N-type regions. The P-type germanium constitutes the base 16 of the transistor and the two N-type regions constitute the emitter 12 and collector 14. The junctions between the P-type and N-type germanium sections act as rectifiers. Very little, if any, current flows through the transistor when the P-type base is negative relative to the N-type emitter, whereas a relatively large current flows when the P-type base is positive relative to the N-type emitter or collector by as little as a fraction of a volt. A source of direct current voltage, such as battery 18, provides the necessary driving potential for transistor 10. The negative terminal of battery 18 is grounded, substantially as shown. Emitter 12 is connected to ground through resistor 20, and base 16 is connected to ground through resistor 22. Base 16 is also connected to ground through rectifier 24 and the secondary winding 26 of a saturable core transformer 28. Collector 14 is connected to the positive terminal of battery 18 through two parallel current paths, one of which includes the primary winding 30 of transformer 28 and the other of which includes a rectifier 32 and resistor 34, in series. Negative trigger voltage pulses are connected between terminal 36 and ground and are applied to the junction of rectifier 32 and resistor 34 through coupling capacitor 38. Output voltage pulses are taken from the oscillator between terminal 40 and ground. Like instantaneous polarities across windings 26 and 30 are indicated by dots. Hence, when the upper terminal of winding 26 is positive, the lower terminal of winding 30 will be positive and vice versa.

Resistors 20 and 22, transistor 10 and saturable core transformer 28 comprise the basic blocking oscillator. Rectifier 32, resistor 34 and capacitor 38 comprise a means of injecting the trigger voltage pulses into the oscillator. Transistor 10 is normally held cut off by virtue of the grounded resistor 22. The proper choice of resistor 20 is required for the best output pulse shape and to prevent free running of the oscillator; however, this resistor need not be of a critical value.

Figure 1A:
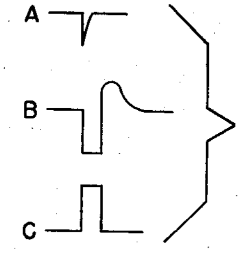
Fig. 1A is an illustration of wave forms appearing at various points in the circuit of Fig. 1.

Wave forms appearing at points A, B and C in the circuit of Fig. 1 are indicated by like reference letters in Fig. 1A. In operation, when a negative trigger pulse is applied to point A (terminal 36) the collector 14 of transistor 10 will be driven negative by virtue of the polarity of rectifier 32. In addition, current flowing through the primary winding 30 of transformer 28 will drive the base 16 positive with respect to ground. Hence, emitter 12 is biased negative with respect to base 16 and the transistor 10 begins conduction. Since this is a regenerative connection, the action will continue until transformer 28 saturates at which time a second regenerative action will be initiated to cut off the transistor. While the transistor is conducting, a negative pulse appears at point B in the circuit, substantially as shown; and a positive output pulse appears at point C (terminal 40). One output pulse will appear at point C for each negative input trigger pulse applied to the circuit.

Figure 2:
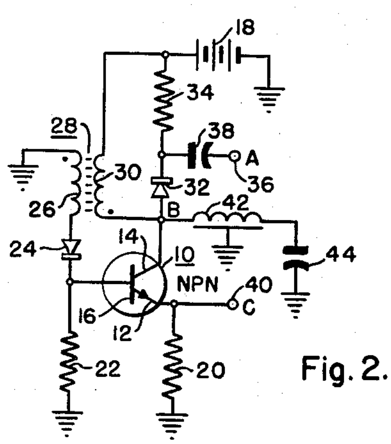
Fig. 2 is a schematic illustration of a modification of the circuit of Fig. 1, employing a delay line to narrow the width of the output pulses from the oscillator.
Figure 2A:
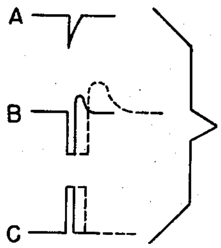
Fig. 2A is an illustration of wave forms appearing at various points in the circuit of Fig. 2.

The circuit of Fig. 2 is identical to that of Fig. 1 with the exception of a delay line 42 and capacitor 44 connected in series between point B and ground. All other elements in Fig. 2 which correspond to elements shown in Fig. 1 are indicated by like reference numerals. With the addition of delay line 42 and capacitor 44, conduction in transistor 10 and, hence, the negative voltage pulse appearing at point B are terminated after the two-way time of the delay line 42 by virtue of capacitor 44 which appears as a short circuit to alternating currents. This method of termination requires a delay line whose one way delay is only one-half of the desired pulse width, since a shorted delay line reflects back to its input a wave equal in width to the input wave but of the opposite polarity and delayed by twice the delay of the delay line. The resulting wave forms appearing at points B and C are shown in Fig. 2A. The width of the pulses without the addition of the delay line 42 is shown by the dotted outline. By the addition of the delay line, the width of the output pulses can be reduced to any reasonable value.

Figure 3:
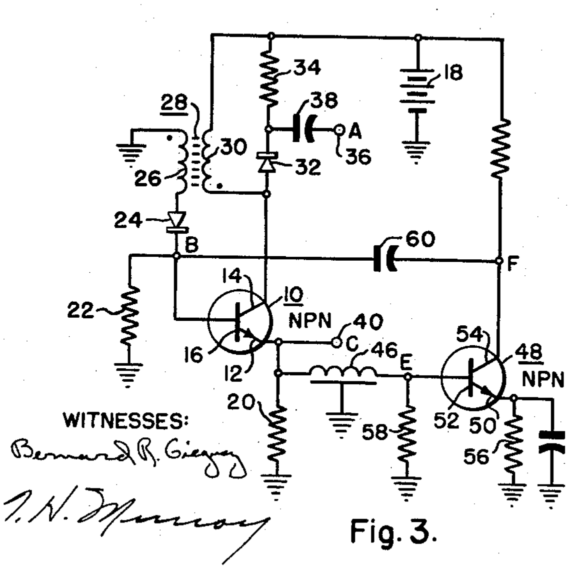
Fig. 3 is a schematic diagram of still another modification of the circuit of Fig. 1.
Figure 3A:
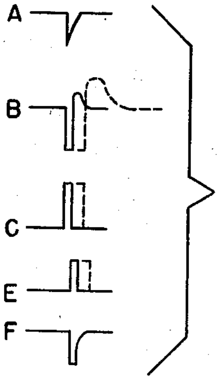
Fig. 3A is an illustration of wave forms appearing at various points in the circuit of Fig. 3.

The circuit of Fig. 3 is a further modification of the circuit of Fig. 1, the essential difference being in the addition of a delay line 46 and a second NPN transistor 48 having an emitter 50, base 52 and collector 54. Transistor 48 is normally held cut off by virtue of the fact that resistor 58 is connected to ground. Delay line 46 connects point C (emitter 12 of transistor 10) to the base 52 of transistor 48, and capacitor 60 connects the collector of transistor 48 to the base 16 of transistor 10. When transistor 10 is triggered by a negative voltage pulse applied to terminal 36, a voltage pulse appears at the emitter 12 of transistor 10 (point C) which is positive with respect to ground. This pulse, after traveling down the delay line 46, drives the base 52 of transistor 48 positive with respect to emitter 50. Hence, transistor 48 will conduct and the negative pulse appearing at its collector (point F) will be coupled back to the base of transistor 10 through capacitor 60, cutting it off. Thus, the pulse appearing at point C is terminated after the one way travel time of the delay line. The circuit shown in Fig. 3 requires a longer delay and one more transistor, but it has the advantage of obtaining a second pulse at point E (Fig. 3A) which is equal in width to the pulse appearing at point C but delayed from this first pulse by the width of the first pulse.

Although the invention has been described in connection with certain specific embodiments, it should be readily apparent to those skilled in the art that various changes in form and arrangement of parts may be made to suit requirements without departing from the spirit and scope of the invention. In this respect, it should be readily apparent that PNP junction transistors or other suitable switching devices could be used in place of the NPN junction transistors shown.

We claim as our invention:

1. A blocking oscillator comprising a source of direct current voltage having its negative terminal connected to a point of reference potential, a junction transistor having an emitter, a collector and a base, a first resistor connecting said emitter to said point of reference potential, a second resistor connecting said base to said point of reference potential, a first unidirectional current device and a resistor connecting said collector to the positive terminal of said voltage source, a saturable core transformer having primary and secondary windings, said collector being connected to the positive terminal of said voltage source through said primary winding, a second unidirectional current device in series with said secondary winding for connecting said base to said point of reference potential, and means for applying trigger voltage pulses to said oscillator.

2. A blocking oscillator comprising a source of direct current voltage having its negative terminal connected to a point of reference potential, a transistor having an emitter, a collector and a base, a first impedance element connecting said emitter to said point of reference potential, a second impedance element connecting said base to said point of reference potential, means including a unidirectional current device for connecting said collector to the positive terminal of said voltage source, means including a second unidirectional current device and a saturable inductive element connecting said base to said point of reference potential, a saturable core member for said inductive element, and means responsive to current flow through said collector for inducing flux in said core member.

3. A blocking oscillator comprising a source of direct current voltage having its negative terminal connected to a point of reference potential, a transistor having an emitter, a collector and a base, means connecting said emitter to said point of reference potential, a pair of parallel current paths connecting said base to said point of reference potential, one of said paths including a unidirectional current device and a first inductive element, a pair of parallel current paths connecting said collector to the positive terminal of said voltage source, one of said latter-mentioned paths including a unidirectional current device and the other of said paths including a second inductive element, and a saturable magnetic core member inductively coupling said first and second inductive elements.

4. A blocking oscillator comprising a source of direct current voltage having its negative terminal connected to a point of reference potential, a transistor having an emitter, a collector and a base, means connecting said emitter to said point of reference potential, a pair of parallel current paths connecting said base to said point of reference potential, one of said paths including a first inductive element, a pair of parallel current paths connecting said collector to the positive terminal of said voltage source, a second inductive element included in one of said latter-mentioned paths, and a saturable magnetic core member inductively coupling said first and second inductive elements.

5. The combination claimed in claim 4 and including a second transistor having an emitter, a collector and a base, a delay line connecting the base of said second transistor to the emitter of the first-mentioned transistor, and means coupling the collector of said second transistor to the base of said first-mentioned transistor.

6. A blocking oscillator comprising a source of direct current voltage having its negative terminal connected to a point of reference potential, a transistor, first, second and third conductors attached to said transistor, means connecting said first conductor to said point of reference potential, a pair of parallel current paths connecting said second conductor to said point of reference potential, one of said paths including a first inductive element, a pair of parallel current paths connecting said third conductor to the positive terminal of said voltage source, a second inductive element included in one of said latter-mentioned paths, and a saturable magnetic core member inductively coupling said first and second inductive elements.

7. The combination claimed in claim 6 together with an electron path including a delay line connecting one of said conductors to said point of reference potential.

8. A blocking oscillator comprising a first transistor having an emitter, a collector and a base, saturable inductive means coupling said collector to said base, a second transistor having an emitter, a collector and a base, means including a delay line connecting the emitter of said first transistor to the base of said second transistor, and means coupling the collector of said second transistor to the base of said first transistor.

9. A blocking oscillator comprising a first transistor having three conductors affixed thereto, inductive means coupling two of said conductors, a second transistor having at least two conductors affixed thereto, means coupling one of said two conductors of said second transistor to one of said two conductors of said first transistor, and means including a delay line for connecting the third conductor of said first transistor to the other of said two conductors of said second transistor.

10. A blocking oscillator comprising a transistor having an emitter, a collector, and a base, means connecting said emitter to said base, a saturable core transformer having two windings inductively associated therewith, means connecting one of said windings to said collector, a unidirectional current device connecting the other of said windings to said base, and means for applying trigger voltage pulses between the collector and base of said transistor.

11. A blocking oscillator comprising a transistor having three conductors affixed thereto, saturable inductive means coupling two of said conductors, means connecting one of said two conductors and the third conductor, and means for applying a source of trigger voltage pulses to said transistor to render it conductive.

(References on following page)

References Cited in the file of this patent

UNITED STATES PATENTS

| | | |
|---|---|---|
| 2,682,615 | Sziklai | June 29, 1954 |
| 2,745,012 | Felker | May 8, 1956 |
| 2,758,206 | Hamilton | Aug. 7, 1956 |

OTHER REFERENCES

Article: Transistors as On-Off Switches in Saturable-Core Circuits, by Bright et al., pages 79–82 of "Electrical Manufacturing," for December 1954.

Article: "Junction Transistor Trigger Circuits," by Flood, pages 128–129 of "Wireless Engineer," for May 1955.